US009063705B2

(12) United States Patent
Howell et al.

(10) Patent No.: US 9,063,705 B2
(45) Date of Patent: Jun. 23, 2015

(54) LATCH MECHANISM FOR SECURING AN ELECTRONIC MODULE

(71) Applicant: International Business Machines Corporation, Armonk, NY (US)

(72) Inventors: Steven E. Howell, Cary, NC (US); Joseph H. McKenzie, Madison, AL (US); Camillo Sassano, Durham, NC (US); Jared E. Schott, Durham, NC (US)

(73) Assignee: Lenovo Enterprise Solutions (Singapore) Pte. Ltd., Singapore (SG)

(*) Notice: Subject to any disclaimer, the term of this patent is extended or adjusted under 35 U.S.C. 154(b) by 116 days.

(21) Appl. No.: 14/076,303

(22) Filed: Nov. 11, 2013

(65) Prior Publication Data

US 2015/0131227 A1    May 14, 2015

(51) Int. Cl.
*G06F 1/16* (2006.01)
*G06F 1/18* (2006.01)

(52) U.S. Cl.
CPC .................................... *G06F 1/185* (2013.01)

(58) Field of Classification Search
USPC ............... 248/566, 220.21, 682, 632, 225.21, 248/440.1, 300, 309.1, 27.1, 27.3, 583; 29/33.2, 33 A, 410; 312/217, 221, 312/223.2, 319.1, 326, 205, 223.1, 334.3, 312/223.5, 223.6, 333; 292/175, 215; 369/30.55, 30.54; 361/679.38, 679.37, 361/679.39, 679.33, 679.36, 679.48, 361/679.46, 679.31, 679.02, 679.34, 361/679.57, 679.47, 679.32, 679.5, 679.41, 361/679.35, 679.08, 679.49; 439/155, 159, 439/342, 160, 607.25, 357, 326, 135, 417, 439/553, 607.33, 620.12, 157, 259, 264; 360/99.06, 251.4, 99.02
See application file for complete search history.

(56) References Cited

U.S. PATENT DOCUMENTS

| | | | | |
|---|---|---|---|---|
| 4,186,290 A | * | 1/1980 | Matsuo | .......................... 200/535 |
| 5,278,730 A | | 1/1994 | Kikinis | |
| 5,331,509 A | | 7/1994 | Kikinis | |
| 5,364,286 A | * | 11/1994 | Matsuoka | ..................... 439/330 |

(Continued)

FOREIGN PATENT DOCUMENTS

EP    0797853 B1    3/2003
WO    WO02099229 A2    12/2012

OTHER PUBLICATIONS

From 68kMLA Wiki, "Macintosh PowerBook 550c",Retrieved from: http://68kmla.org/wiki/index.php?title=Macintosh_PowerBook_550c&oldid=2459, May 30, 1995, 4 pages.
"PowerBook 550c" Codename: Bonsai, May 1995, 2 pages.
"Macintosh PowerBook 550c", Apple Service Source, May 1995, 175 pages.

*Primary Examiner* — Hung Duong
(74) *Attorney, Agent, or Firm* — Katherine S. Brown; Jeffrey L. Streets

(57) ABSTRACT

An apparatus includes a frame forming a bay for receiving an electronic module having a blind mate connector for coupling with a chassis connector. An actuator is slidably secured to the frame and forms a push button, an intermediate actuation member, and a distal actuation member. A spring latch is biased to latch the module in place. An ejection lever is pivotally secured to one side of the bay, and has a first end aligned with the distal actuation member and a second end disposed to engage the module. Pushing the push button causes the intermediate actuation member to withdraw the spring latch from the bay and then causes the distal actuation member to pivot the ejection lever to unseat and eject the module.

20 Claims, 9 Drawing Sheets

(56) References Cited

U.S. PATENT DOCUMENTS

| | | |
|---|---|---|
| 5,530,302 A | 6/1996 | Hamre et al. |
| 5,861,873 A | 1/1999 | Kikinis |
| 6,071,748 A | 6/2000 | Modlin et al. |
| 6,752,663 B2 * | 6/2004 | Bright et al. ............. 439/607.25 |
| 6,982,431 B2 | 1/2006 | Modlin et al. |
| 7,233,319 B2 | 6/2007 | Johnson et al. |
| 7,855,876 B2 | 12/2010 | Zhu et al. |

* cited by examiner

LATCH MECHANISM FOR SECURING AN ELECTRONIC MODULE

BACKGROUND

1. Field of the Invention

The present invention relates to latch mechanisms for selectively securing an electronic module in an installed position.

2. Background of the Related Art

The configuration of a computer system can vary widely in accordance with the demands to be placed on the computer system. For some applications, an entirely new configuration may be needed to effectively accomplish a desired load as a desired level of performance. In other applications, the performance of a particular computer system may be increased through the use of one or more expansion cards, which may provide a specialized function or expanded capacity to the computer system. Some of these expansion card may be hot swappable, meaning that the expansion card may be installed or uninstalled without shutting down the rest of the computer system.

In order to meet ever-increasing demands for computer capacity and performance, there is pressure to put more components in a smaller space and to avoid shutting down computer systems when new or replacement expansion cards are necessary. However, an expansion card or electronic module needs to be secured to a computer system during operation. Unfortunately, latch mechanisms used to secure an expansion module take up valuable space without adding to the capacity or performance of the computer system.

BRIEF SUMMARY

One embodiment of the present invention provides an apparatus comprising a frame forming a bay and having a proximal end having an opening for receiving an electronic module into the bay, and a distal end having an opening for coupling a first connector at a distal end of the frame to a second connector on the electronic module. An actuator is slidably secured to the frame outside of the bay and extends from a proximal end of the frame toward a distal end the frame, wherein the actuator forms a push button at the proximal end, an intermediate actuation member, and a distal actuation member. A spring latch is secured to the frame and biased to extend a latch key into the bay to engage and latch the electronic module in an operable position within the bay, wherein the spring latch is aligned with the intermediate actuation member. Still further, an ejection lever includes a first end outside of the bay, a second end inside the bay, and a middle portion between the first and second ends that is pivotally secured to one side of the bay, wherein the first end of the ejection lever is aligned with the distal actuation member, and wherein the second end of the ejection lever is disposed to engage a distal end of the electronic module. Accordingly, pushing the push button in the distal direction causes the intermediate actuation member to withdraw the spring latch from the bay and then causes the distal actuation member to pivot the ejection lever so that the second end of the ejection lever moves toward the proximal end of the frame.

Another embodiment of the present invention provides a system comprising a chassis securing a computer system that includes a first connector for coupling with a second connector on an electronic module. A frame is secured to the chassis and forms a bay with a proximal end having an opening for receiving the electronic module into the bay, and a distal end having an opening for blind coupling of the second connector on the electronic module to the first connector. An actuator is slidably secured to the frame outside of the bay and extending from a proximal end of the frame toward a distal end the frame, wherein the actuator includes a push button at the proximal end, an intermediate actuation member, and a distal actuation member. A spring latch is secured to the frame and biased to extend a latch key into the bay to engage and latch the electronic module in an operable position within the bay, wherein the spring latch is aligned with the intermediate actuation member. Still further, an ejection lever includes a first end outside of the bay, a second end inside the bay, and a middle portion between the first and second ends that is pivotally secured to one side of the bay, wherein the first end of the ejection lever is aligned with the distal actuation member, and wherein the second end of the ejection lever is disposed to engage a distal end of the module. The system further comprises an electronic module receivable within the bay, wherein the electronic module has a housing with a latch surface for receiving the latch key when the second connector on the module has been coupled to the first connector in the chassis. Accordingly, pushing the push button in the distal direction causes the intermediate actuation member to withdraw the latch key from the bay and then causes the distal actuation member to pivot the ejection lever so that the second end of the ejection lever pushes the module toward the proximal end of the frame until the first connector is disconnected from the second connector.

DETAILED DESCRIPTION

Figure 1:
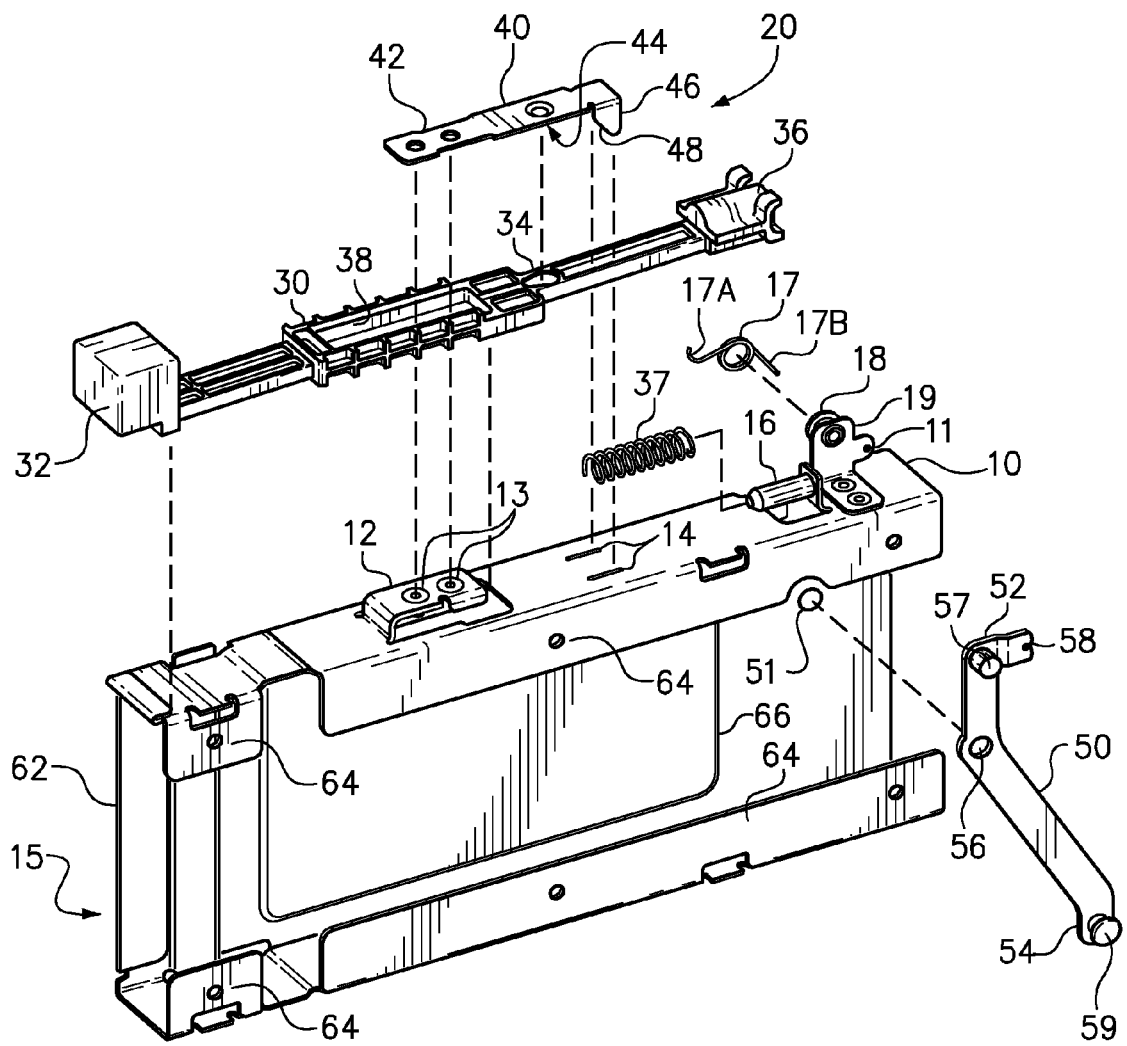
FIG. 1 is a perspective assembly view of a frame with a latch mechanism in accordance with one embodiment of the present invention.

One embodiment of the present invention provides an apparatus comprising a frame forming a bay and having a proximal end having an opening for receiving an electronic module into the bay, and a distal end having an opening for coupling a first connector at a distal end of the frame to a second connector on the electronic module. An actuator is slidably secured to the frame outside of the bay and extends from a proximal end of the frame toward a distal end the frame, wherein the actuator forms a push button at the proximal end, an intermediate actuation member, and a distal actuation member. A spring latch is secured to the frame and biased to extend a latch key into the bay to engage and latch a module in an operable position within the bay, wherein the spring latch is aligned with the intermediate actuation member. Still further, an ejection lever includes a first end outside of the bay, a second end inside the bay, and a middle portion between the first and second ends that is pivotally secured to one side of the bay, wherein the first end of the ejection lever is aligned with the distal actuation member, and wherein the second end of the ejection lever is disposed to engage a distal end of the module. Accordingly, pushing the push button in the distal direction causes the intermediate actuation member to withdraw the spring latch from the bay and then causes the distal actuation member to pivot the ejection lever so that the second end of the ejection lever moves toward the proximal end of the frame.

The apparatus may further include an actuator return spring, such as a compression spring, disposed between the frame and the actuator to bias the actuator toward the proximal end of the frame. In addition, the apparatus may include a spring, such as a torsion spring, disposed between the frame and the ejection lever to forward bias the first end of the ejection lever. Both of these springs act to put the latch mechanism back in an original position in which the latch mechanism is ready to secure an electronic module.

In a further embodiment of the invention, the apparatus may include a boss formed on one side of the bay to prevent the module from hitting the ejection lever. The ejection lever operates along the same side of the bay and on the distal end of the frame from the boss. The second end of the ejection lever may include a pin that extends laterally beyond the boss into the path of the module to engage a distal end of the module. Since the second end engages the distal end of the installed module, actuating the first end of the ejection lever causes the second end of the ejection lever to unseat the first and second connectors and eject the module, at least to the point where the module is accessible and freely withdrawn from the bay. The boss may also serve to align the module within the bay so that the second connector on the module is aligned with the first connector at the distal end of the frame. Still further, the apparatus may include an electromagnetic compatibility (EMC) gasket secured on the same side of the frame as the boss and on the proximal end of the frame from the boss. The boss protects the EMC gasket from being damaged. Preferably, the EMC gasket extends around the entire opening to the frame and protected within a recess or being aligned with a boss.

The spring latch is preferably a leaf spring latch, such as a leaf spring latch made of a flexible metal sheet. One end is secured to the frame and the other end forms a latch key for securing the electronic module in the operable position. The latch key extends through the frame and into the bay to engage a feature of the fully installed electronic module. The latch key preferably has a proximal edge that is slanted relative to the frame to allow the act of inserting an electronic module into the bay to open the spring latch without using the actuator. Once the latch feature of the electronic module aligns with the latch key, the spring latch biases the latch key into the latch feature such that the electronic module becomes latched within the bay. The electronic module may have no moving parts involved in installing, latching or ejecting the electronic module.

Another embodiment of the present invention provides a system comprising a chassis securing a computer system that includes a first connector for coupling with a second connector on an electronic module. A frame is secured to the chassis and forms a bay with a proximal end having an opening for receiving the electronic module into the bay, and a distal end having an opening for blind coupling of the second connector on the electronic module to the first connector. An actuator is slidably secured to the frame outside of the bay and extending from a proximal end of the frame toward a distal end the frame, wherein the actuator includes a push button at the proximal end, an intermediate actuation member, and a distal actuation member. A spring latch is secured to the frame and biased to extend a latch key into the bay to engage and latch a electronic module in an operable position within the bay, wherein the spring latch is aligned with the intermediate actuation member. Still further, an ejection lever includes a first end outside of the bay, a second end inside the bay, and a middle portion between the first and second ends that is pivotally secured to one side of the bay, wherein the first end of the ejection lever is aligned with the distal actuation member, and wherein the second end of the ejection lever is disposed to engage a distal end of the electronic module.

The system further comprises an electronic module receivable within the bay, wherein the electronic module has a housing with a latch surface for receiving the latch key when the second connector on the electronic module has been coupled to the first connector in the chassis. Accordingly, pushing the push button in the distal direction causes the intermediate actuation member to withdraw the latch key from the bay and then causes the distal actuation member to pivot the ejection lever so that the second end of the ejection lever pushes the electronic module toward the proximal end of the frame until the first connector is disconnected from the second connector.

FIG. 1 is a perspective assembly view of a frame 10 with a latch mechanism 20 in accordance with one embodiment of the present invention. The latch mechanism 20 includes an actuator 30, a spring latch 40, and an ejection lever 50. The actuator 30 includes a push button 32, an intermediate actuation member 34 for actuating the spring latch 40, and a distal actuation member 36 for actuating the ejection lever 50. A channel 38 allows the actuator to extend around a bracket 12 on the top edge of the frame 10.

The spring latch 40 is positioned over the intermediate actuation member 34 and a pair of fasteners 13 may be used to secure a proximal end 42 of the spring latch to the bracket 12, preferably to the underneath face of the bracket. The spring latch 40 includes a camming surface 44, such as a convex dimple, facing and received in a concave dimple of the intermediate actuation member 34. Furthermore, the spring latch 40 has a distal end forming a latch key 46 that extends toward the frame 10 and extends through a hole 14 and into the bay 15 for engagement with an electronic module. A preferred latch key 46 has a slanted proximal surface 48 that allows an electronic module to be inserted into the frame and latched by the spring latch 40 without using the actuator.

An actuator return spring 37, such as a compression spring, is disposed between the frame 10 and the actuator 30 to bias the actuator toward the proximal end of the frame. Specifically, the spring 37 is received about the alignment pin 16. When the actuator 30 is in its operable position adjacent the top edge of the frame 10, the alignment pin 16 may extend into the distal actuation member 36 to maintain alignment there between. The actuator return spring 37 pushes against the distal actuation member 36 to bias the actuator 30 toward the proximal end of the frame.

The ejection lever 50 has a first (upper) end 52 supporting an actuation pin 57 and a spring catch arm 58. The first end 52 extends through the top edge of the frame 10, such that the actuation pin 57 aligns with the distal actuation member 36. The spring catch arm 58 receives a first end 17A of a torsion spring 17. A bracket 19 secured to the frame 10 has a pin 18 that extends through and secures the torsion spring 17, and also has a hole 11 for receiving a second end 17B of the torsion spring 17. In operation, the spring 17 forward biases the first end 52 of the ejection lever 50.

The ejection lever 50 also has a pivot hole 56 for pivotally securing the ejection lever 50 to one side of the frame 10, such as at the pivot hole 51 using a fastener (not shown). Therefore, a second end 54 of the ejection lever extends downwardly and distally from the point of the pivot hole 56. A pin 59 extends laterally from the second end 54 for engaging an electronic module (not shown).

The frame 10 further includes a first wall 62 and at least tabs 64 that serve as a second wall for receiving an electronic module of complementary dimensions. The first wall 62 has a boss 66 that is raised inwardly from the plane of the first wall 62 to guide an electronic module being inserted into the bay 15 so that the leading end of the electronic module will not hit the ejection lever 50. Only the pin 59 that extends laterally beyond the boss 66 engages the electronic module.

Figure 2:
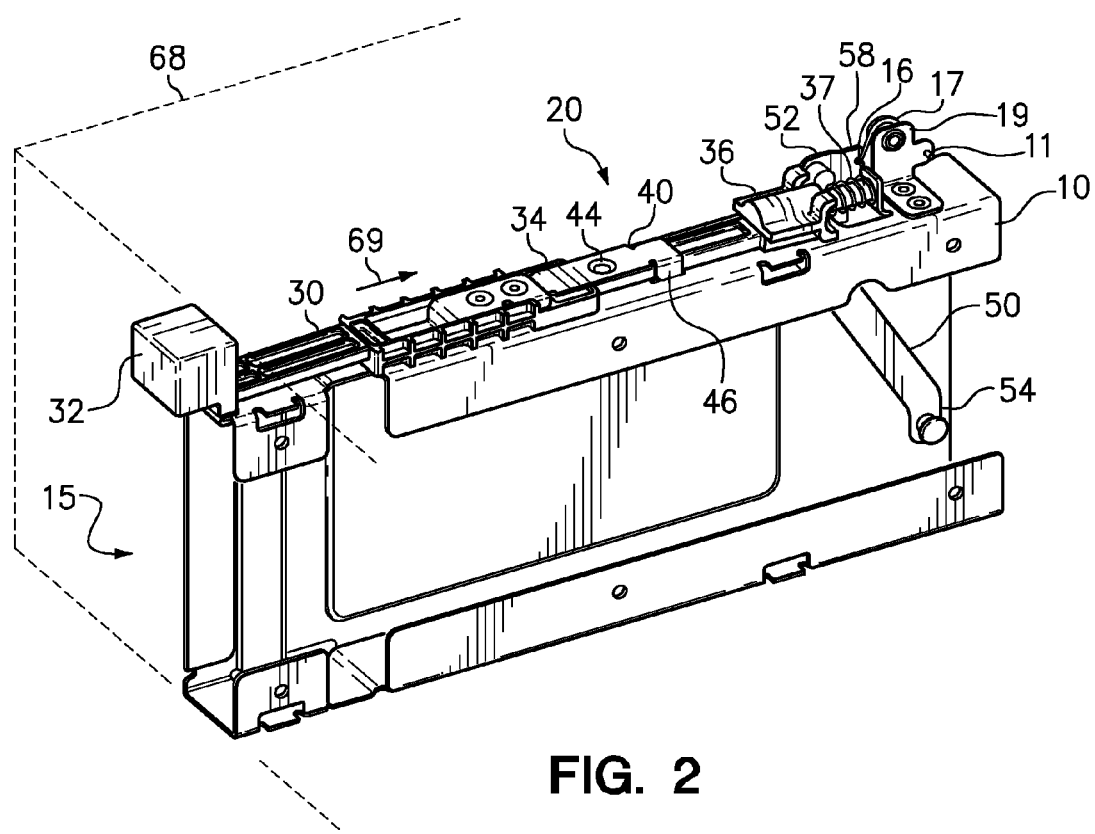
FIG. 2 is a perspective view of the frame with the latch mechanism assembled.

FIG. 2 is a perspective view of the frame 10 with the latch mechanism 20 assembled. The push button 32 of the actuator 30 is accessible for pushing with a user's finger. Typically, the proximal opening to the bay 15 will be along a front of a chassis (see outline 68). Pushing the push button 32 with sufficient force to overcome the actuator return spring 37 will move the actuator in the distal direction (see arrow 69). Note that the camming surface 44, such as a downwardly convex dimple, is received in a convex dimple of the intermediate actuation member 34 and the alignment pin 16 is aligned with and received in the distal actuation member 36. Also note that the torsion spring 17 has is positioned with a first end 17A received in the spring catch arm 58 and a second end 17B received in the hole 11 in the bracket 19 secured to the frame 10. In operation, the spring 17 forward biases the first end 52 of the ejection lever 50, which moves the second end 54 of the ejection lever 50 distally. Optionally, the actuator 30 may be held in place primarily by the downward force of the spring latch 40 and the alignment pin 16, although additional securing or alignment features may be implemented.

Figure 3:
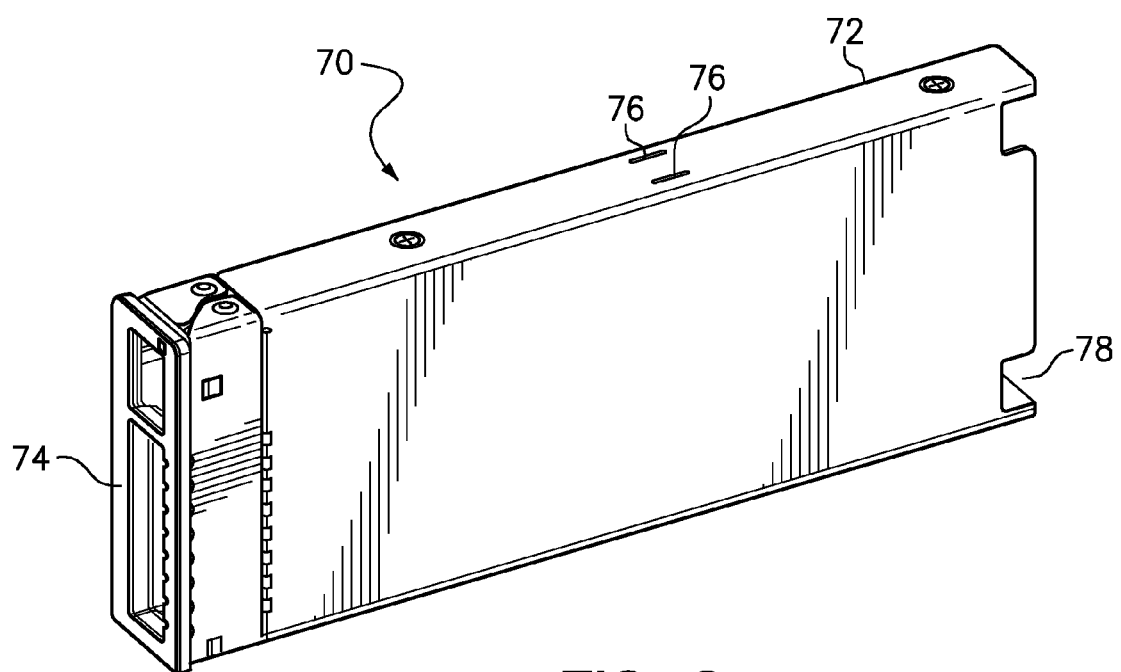
FIG. 3 is a perspective view of an electronic module that is securable within the frame.

FIG. 3 is a perspective view of an electronic module 70 that is securable within the frame of FIG. 2. The electronic module 70 has a housing 72, which may include a front bezel 74 having controls, displays, light paths, airflow pathways, and input/output (I/O) connectors, such as Ethernet and Serial Attached SCSI (SAS). The electronic module may further include features to provide electromagnetic compatibility (EMC) shielding so that excessive electromagnetic energy is not passed into or out of the electronic module 70, frame 10, or chassis 68. The electronic module 70 further includes a pair of holes 76 for receiving a pair of latch keys 46 (See FIG. 2) when the electronic module is installed within the frame 10. A notch 78 is provided on the distal end of the electronic module 70 for engagement with the ejection lever 50 (See FIG. 2).

Figure 4:
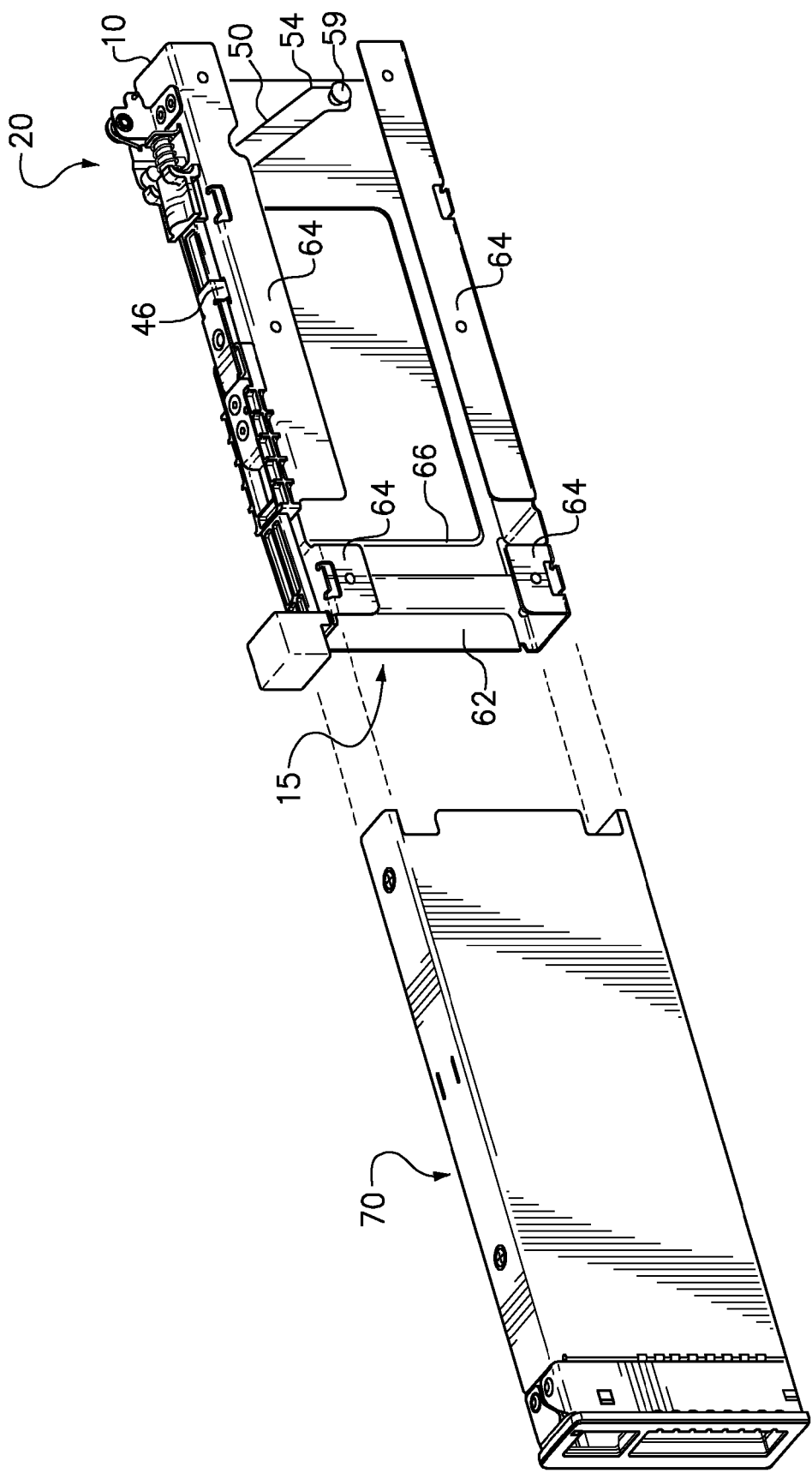
FIG. 4 is a perspective view of the electronic module aligned for installation into a bay formed by the frame.

FIG. 4 is a perspective view of the electronic module 70 aligned for installation into a bay 15 formed by the frame 10. The electronic module 70 may be manually slid into the bay 15 between the first wall 62 and the tabs (or second wall) 64. A distal end of the electronic module 70 is inserted into the proximal opening of the frame 10 and will the subsequently encounter the proximal edge of the boss 66, the latch keys 46, and the pin 59 on the second end 54 of the ejection lever 50.

Figure 5:
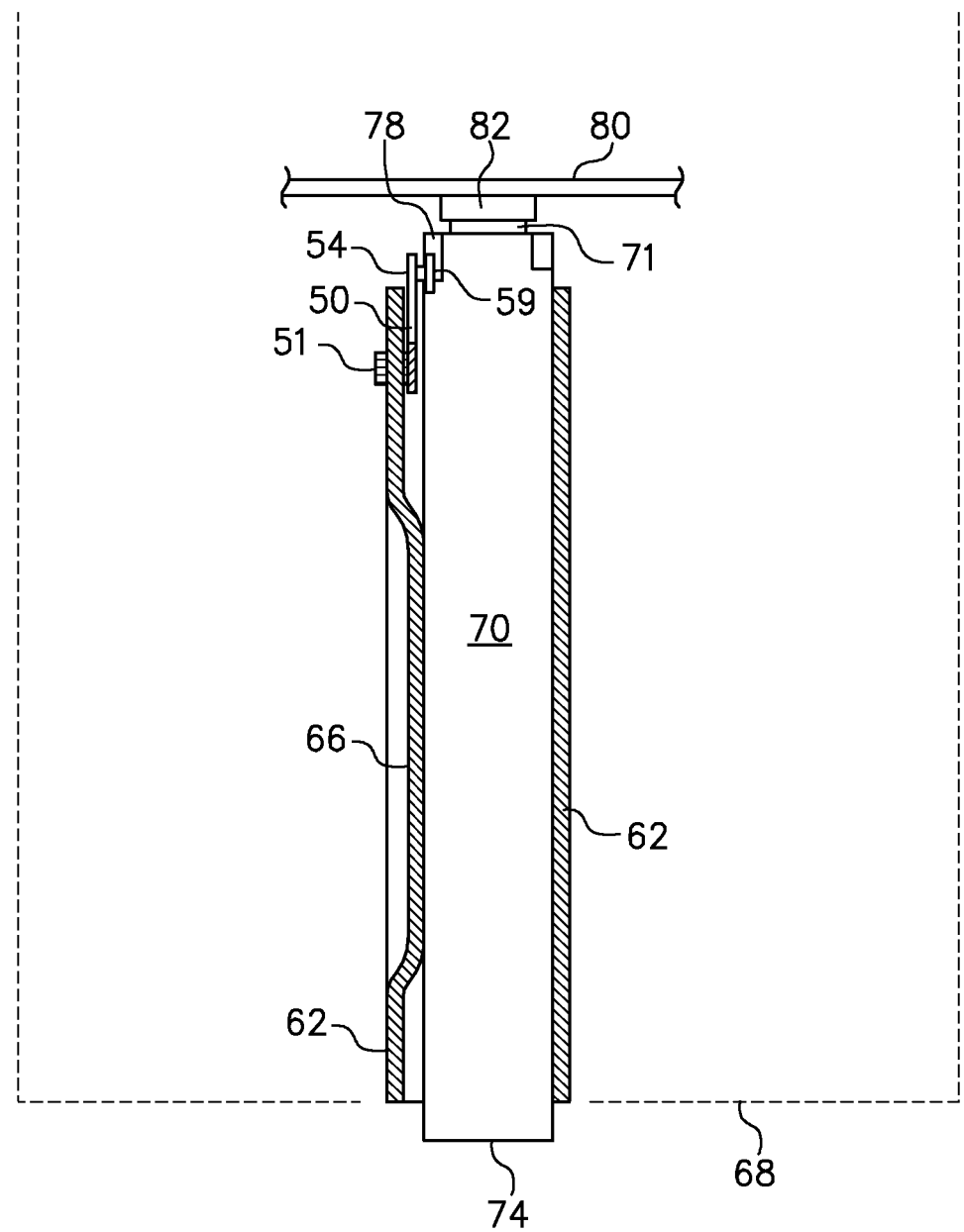
FIG. 5 is a partial cross-sectional view of the electronic module extending along a boss to avoid hitting the ejection lever and to align the electronic module with a connector

FIG. 5 is a partial cross-sectional view of the electronic module 70 that has been received into an operable position within the frame 10. The electronic module 70 extending along the boss 66, which guides and holds the electronic module on a path that avoids hitting the ejection lever 50. Only the pin 59 extends laterally to engage the notch 78 in the distal end of the electronic module 70. In this position, a first connector 82 on a circuit board 80 secured within the chassis 68 is coupled to a second connector 71 on the distal end of the electronic module 70.

Figure 6A:
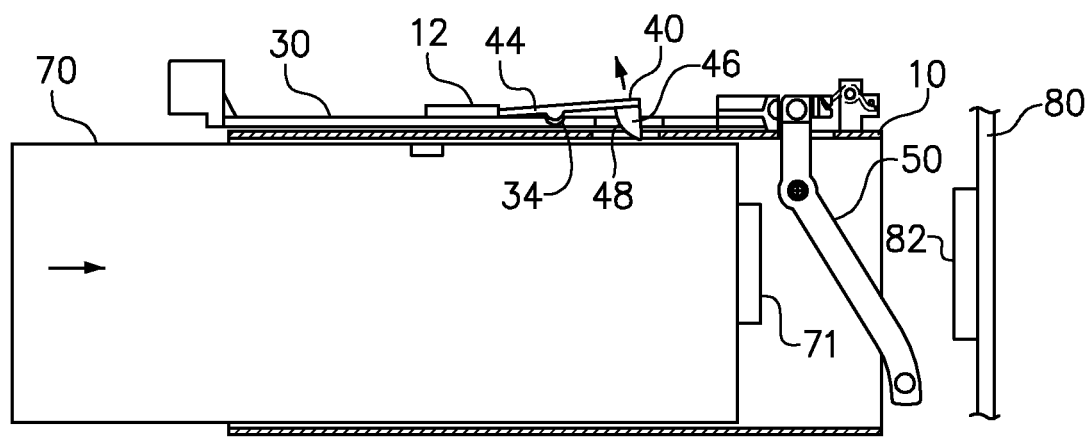
FIG. 6A is a schematic side view of the electronic module being slid into the frame.

FIG. 6A is a schematic side view of the electronic module 70 being slid into the bay formed by the frame 10. As the electronic module 70 has moved distally (to the right in FIG. 6A) and encountered the latch key 46, the slanted proximal surface 48 has allowed the latch key 46 to ride up and out of the way of the electronic module. Accordingly, the electronic module 70 may be freely pushed further into the frame 10 until the second connector 71 on the distal end of the electronic module 70 is coupled to the first connector 82 on the printed circuit board 80.

Figure 6B:
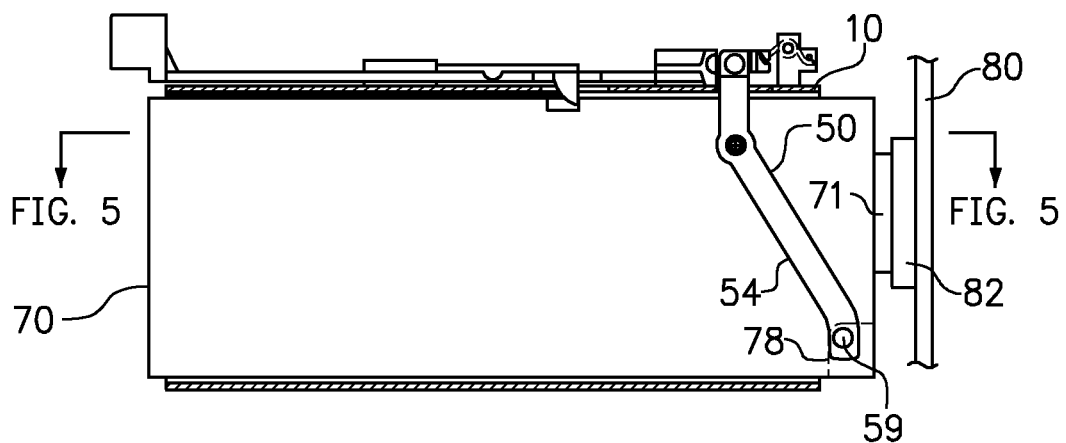
FIG. 6B is a schematic side view of the electronic module in the installed position within the frame.

FIG. 6B is a schematic side view of the electronic module 70 in the installed (operable) position within the frame 10. As shown, the second connector 71 on the distal end of the electronic module 70 is coupled to the first connector 82 on the printed circuit board 80. Also, the pin 59 on the second end 54 of the ejection lever 50 has engaged the notch 78 in the distal end of the electronic module 70. Note that the actuator 30 is not actuated during the installation of the electronic module.

Figure 6C:
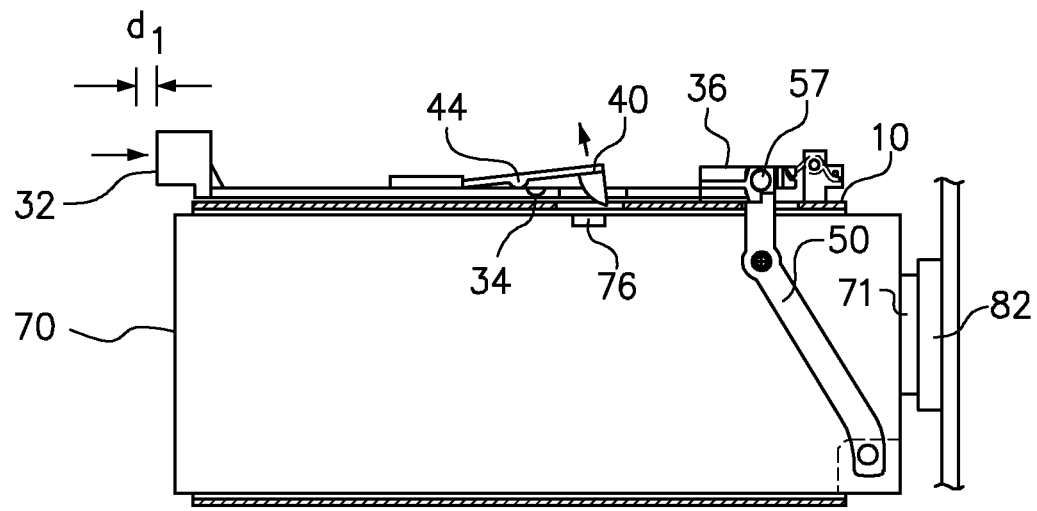
FIG. 6C is a schematic side view of the electronic module being unlatched by pushing the actuator a first distance.

FIG. 6C is a schematic side view of the electronic module 70 being unlatched from the frame 10 by pushing the actuator 30 a first distance ($d_1$). Pushing the push button 32 at the proximal end of the frame 10 (i.e., accessible to the user at the front of the chassis), the intermediate actuation member 34 of the actuator 30 causes the spring latch 40 to disengage from the notch 76 in the electronic module 70. Specifically, the camming member (convex dimple) 44 on the spring latch 70 rides up and out of the concave dimple 34 in the actuator 40. While the electronic module 70 is now unlatched, the first and second connectors 71, 82 are still coupled. Notice that the distal actuation member 36 is now adjacent or in initial contact with the pin 57 at the first end of the ejection lever 50, but the ejection lever has not yet been actuated.

Figure 6D:
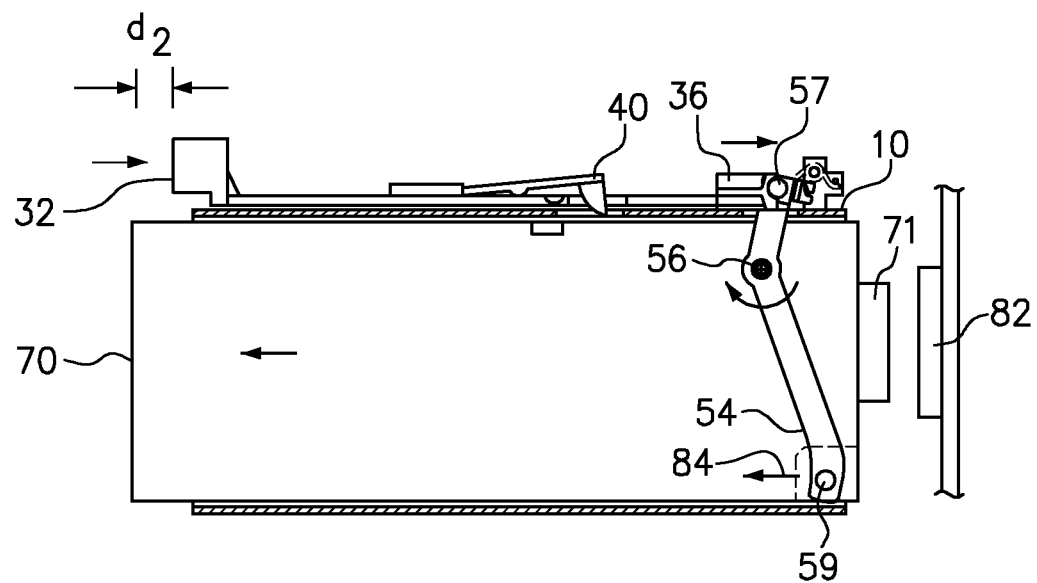
FIG. 6D is a schematic side view of the electronic module being ejected by pushing the actuator a second distance.

FIG. 6D is a schematic side view of the electronic module 70 being ejected by pushing the actuator 30 a second distance ($d_2$) that is greater than the first distance ($d_1$). While the spring latch 40 remains raised with the latch key 46 out of the path of the electronic module 70, the additional distal movement of the actuator 30 from FIG. 6C to FIG. 6D actuates the ejection lever 50. Specifically, the distal actuation member 36 has pushed the pin 57 such that the entire ejection lever 50 rotates about the pivot axis defined by the pivot hole 56. Accordingly, the pin 59 at the second (lower) end 54 of the ejection lever 50 moves in the proximal direction (see arrow 84) and pushes the module in the proximal direction. With sufficient force applied to the push button 32, the ejection lever 50 will overcome the frictional forces between the seated connectors 71, 82 to unseat the connectors. Preferably, the ejection lever 50 will also move the electronic module 70 a sufficient proximal distance so that the module extends out of the frame or chassis to where a user can comfortable grasp the proximal end of the electronic module 70.

Referring to both FIGS. 6C and 6D, the latch mechanism is shown to be capable of releasing and ejecting the electronic module with a single push button motion. Furthermore, the latch mechanism requires very little physical space and does not interfere with the available area on the front face of the electronic module. Still further, the latch mechanism is provided as part of the frame or chassis, and not moving parts are required to be on the electronic module.

Figure 7A:
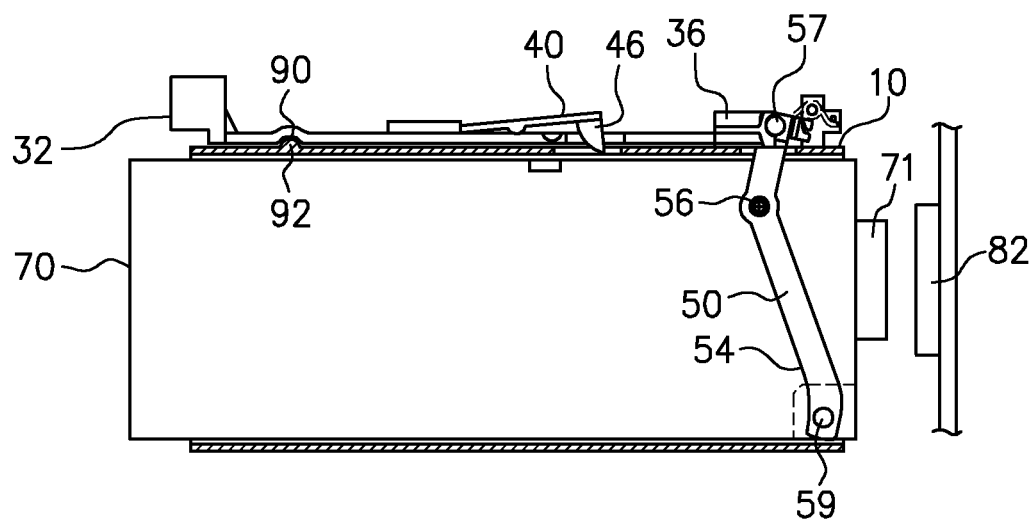
FIG. 7A is a schematic side view of the electronic module being slid into the frame, wherein the latch mechanism includes a detent.

FIG. 7A is a schematic side view of the electronic module 70 being slid into the frame 10, wherein the actuator 30 includes a detent 90 and the frame includes a convex dimple 92. The detent 90 and dimple 92 hold the actuator 10 in the position shown. A spring force in the actuator 10 is sufficient to prevent the actuator return spring 37 and the torsion spring 17 from pushing the actuator in the proximal direction. Accordingly, the spring latch 40 remains raised with the latch key 46 out of the path of the electronic module 70 and the ejection lever 50 is in a proximal position.

Figure 7B:
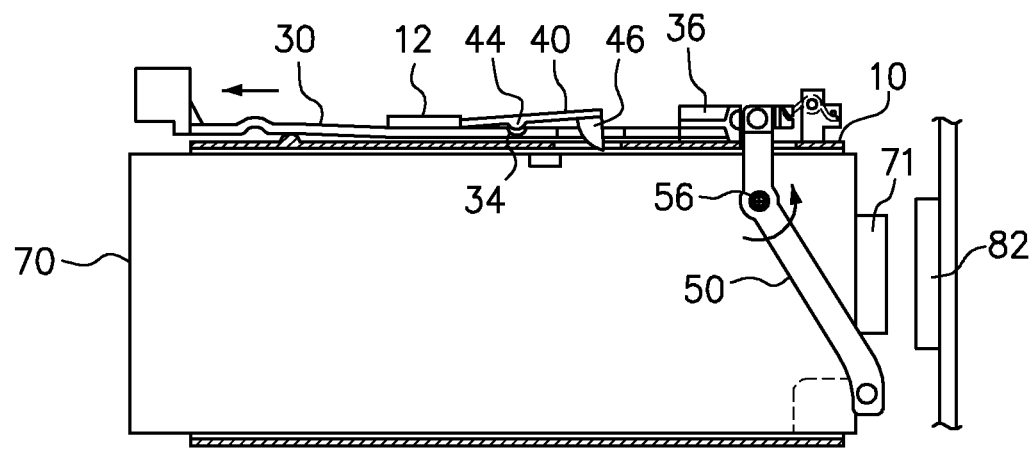
FIG. 7B is a schematic side view of the electronic module after the electronic module has caused the actuator to overcome the detent.

FIG. 7B is a schematic side view of the electronic module 70 after the electronic module has caused the actuator 30 to overcome the resistance force between the detent 90 and dimple 92. The resistance force between the detent and dimple is overcome by adding the force of the electronic module 70 pushing on the lower end 54 of the ejection lever 50, which then causes the upper end of the ejection lever 50 to push on the distal actuation member 36 and move the actuator 30 in the proximal direction. Once the resistance force between the detent and dimple is overcome, the actuator return spring 37 pushes the actuator 30 in the proximal direction and the torsion spring 17 rotates the ejection lever as shown. Note that a portion of the actuator 30 has slid up and over the dimple 92 in the frame 10. Also note that the latch key 46 is no longer raised by the concave dimple 34 in the actuator 40, but rather is riding against the surface of the electronic module 70.

Figure 7C:
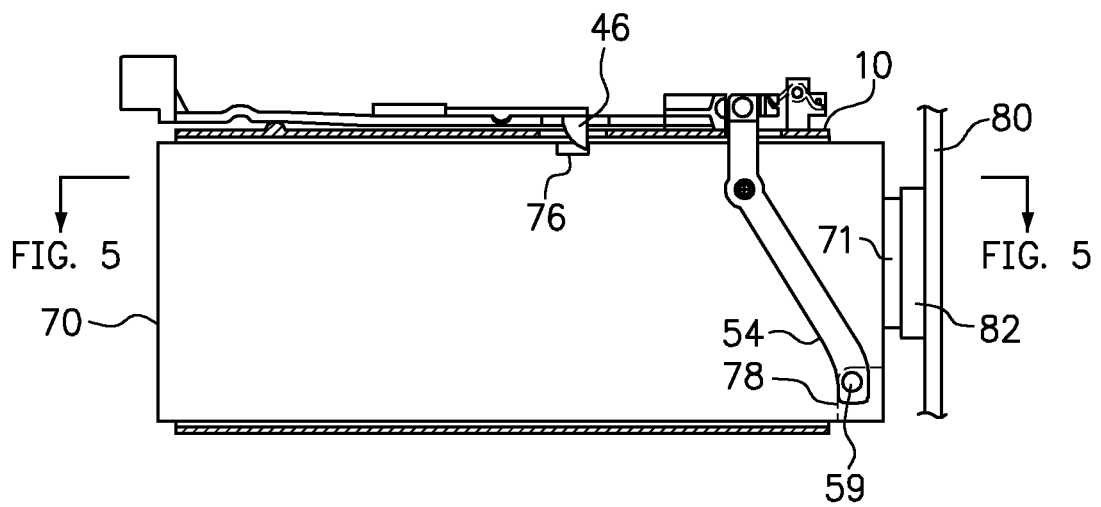
FIG. 7C is a schematic side view of the electronic module in the installed and latched position within the frame.

FIG. 7C is a schematic side view of the electronic module 70 in the installed and latched position within the frame. With the electronic module 70 in the installed position, the latch key 46 enters the notch 76 in the electronic module.

Figure 7D:
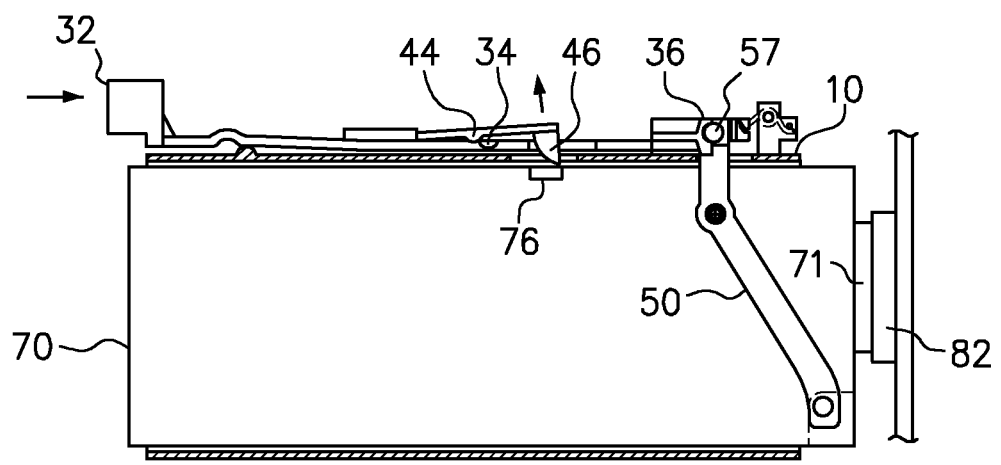
FIG. 7D is a schematic side view of the electronic module being unlatched by pushing the actuator a first distance.

FIG. 7D is a schematic side view of the electronic module 70 being unlatched by pushing the actuator 30 a first distance. By pushing on the push button 32, the actuator 30 moves distally to raise the latch key 46 and engage the actuation pin 57 on the first end of the ejection lever 50. With the electronic module now unlatched, further distal movement of the actuator 30, caused by pushing the push button 32 a second distance, will unseat the connectors 71, 82 and reposition the detent 90 to seat with the dimple 92 as shown in FIG. 7A. As shown in FIG. 7A, the electronic module has been unlatched and ejected to the point that the electronic module 70 can be easily grasped and removed by a user. A potential benefit of the embodiment in FIGS. 7A-7D is that the push button 32 remains in the distal position (of FIG. 7A) while the user is grasping the electronic module 70.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:
a frame forming a bay and having a proximal end having an opening for receiving an electronic module into the bay, and a distal end having an opening for coupling a first connector at a distal end of the frame to a second connector on the electronic module;
an actuator slidably secured to the frame outside of the bay and extending from a proximal end of the frame toward a distal end the frame, wherein the actuator forms a push button at the proximal end, an intermediate actuation member, and a distal actuation member;
a spring latch secured to the frame and biased to extend a latch key into the bay to engage and latch the electronic module in an operable position within the bay, wherein the spring latch is aligned with the intermediate actuation member; and
an ejection lever including a first end outside of the bay, a second end inside the bay, and a middle portion between the first and second ends that is pivotally secured to one side of the bay, wherein the first end of the ejection lever is aligned with the distal actuation member, and wherein the second end of the ejection lever is disposed to engage a distal end of the electronic module;
wherein pushing the push button in the distal direction causes the intermediate actuation member to withdraw the spring latch from the bay and then causes the distal actuation member to pivot the ejection lever so that the second end of the ejection lever moves toward the proximal end of the frame.

2. The apparatus of claim 1, further comprising:
a spring disposed between the frame and the actuator to bias the actuator toward the proximal end of the frame.

3. The apparatus of claim 1, further comprising:
a spring disposed between the frame and the ejection lever to forward bias the first end of the ejection lever.

4. The apparatus of claim 1, wherein the latch key has a proximal edge that is slanted relative to the frame to allow the electronic module to open the spring latch and become latched within the bay without actuating the actuator.

5. The apparatus of claim 1, further comprising:
a boss formed on one side of the bay to prevent the electronic module from hitting the ejection lever.

6. The apparatus of claim 5, wherein the boss aligns the electronic module within the bay so the second connector on the electronic module is aligned with the first connector at the distal end of the frame.

7. The apparatus of claim 5, wherein the second end of the ejection lever includes a pin that extends laterally beyond the boss to engage a distal end of the electronic module.

8. The apparatus of claim 5, further comprising:
an electromagnetic compatibility gasket secured on at least one side of the frame in front of the boss.

9. The apparatus of claim 1, wherein the electronic module has no moving parts involved in installing, latching or ejecting the electronic module.

10. The apparatus of claim 1, further comprising:
a detent between the frame and the actuator.

11. A system, comprising:
a chassis securing a computer system including a first connector for coupling with a second connector on an electronic module;
a frame secured to the chassis and forming a bay with a proximal end having an opening for receiving the electronic module into the bay, and a distal end having an opening for blind coupling of the second connector on the electronic module to the first connector;
an actuator slidably secured to the frame outside of the bay and extending from a proximal end of the frame toward a distal end the frame, wherein the actuator forms a push button at the proximal end, an intermediate actuation member, and a distal actuation member;
a spring latch secured to the frame and biased to extend a latch key into the bay to engage and latch the electronic module in an operable position within the bay, wherein the spring latch is aligned with the intermediate actuation member; and
an ejection lever including a first end outside of the bay, a second end inside the bay, and a middle portion between the first and second ends that is pivotally secured to one side of the bay, wherein the first end of the ejection lever is aligned with the distal actuation member, and wherein the second end of the ejection lever is disposed to engage a distal end of the electronic module; and
an electronic module receivable within the bay, wherein the electronic module has a housing with a latch surface for receiving the latch key when the second connector on the electronic module has been coupled to the first connector in the chassis;
wherein pushing the push button in the distal direction causes the intermediate actuation member to withdraw the latch key from the bay and then causes the distal actuation member to pivot the ejection lever so that the second end of the ejection lever pushes the electronic module toward the proximal end of the frame until the first connector is disconnected from the second connector.

12. The system of claim 11, further comprising:
a spring disposed between the frame and the actuator to bias the actuator toward the proximal end of the frame.

13. The system of claim 11, further comprising:
a spring disposed between the frame and the ejection lever to forward bias the first end of the ejection lever.

14. The system of claim 11, wherein the latch key has a proximal edge that is slanted relative to the frame to allow the electronic module to open the spring latch and become latched within the bay without actuating the actuator.

15. The system of claim 11, further comprising:
a boss formed on one side of the bay to prevent the electronic module from hitting the ejection lever.

16. The system of claim 15, wherein the boss aligns the electronic module within the bay so that connectors on the electronic module are aligned with connectors in the chassis.

17. The system of claim 15, further comprising:
an electromagnetic compatibility gasket secured on one side of the frame in front of the boss.

18. The system of claim 15, wherein the second end of the ejection lever includes a pin that extends laterally beyond the boss to engage a distal end of the electronic module.

19. The system of claim 18, wherein the distal end of the electronic module includes a recess for engaging the pin of the ejection lever.

20. The system of claim 11, wherein the electronic module has no moving parts involved in installing, latching or ejecting the electronic module.

* * * * *